US009966685B2

(12) United States Patent
Kim et al.

(10) Patent No.: US 9,966,685 B2
(45) Date of Patent: May 8, 2018

(54) ELECTRIC CONNECTING TERMINAL FOR ELECTRICALLY CONNECTING OBJECTS

(71) Applicant: JOINSET CO., LTD., Ansan-si, Kyeonggi-do (KR)

(72) Inventors: Sun-Ki Kim, Gunpo-si (KR); Kee-Han Park, Ansan-si (KR)

(73) Assignee: JOINSET CO., LTD. (KR)

( * ) Notice: Subject to any disclaimer, the term of this patent is extended or adjusted under 35 U.S.C. 154(b) by 0 days. days.

(21) Appl. No.: 15/441,570

(22) Filed: Feb. 24, 2017

(65) Prior Publication Data

US 2017/0162972 A1 Jun. 8, 2017

Related U.S. Application Data

(63) Continuation of application No. PCT/KR2016/003980, filed on Apr. 18, 2016.

(30) Foreign Application Priority Data

Aug. 7, 2015 (KR) ........................ 10-2015-0111612
Sep. 2, 2015 (KR) ........................ 10-2015-0124490
Sep. 16, 2015 (KR) ........................ 10-2015-0131270

(51) Int. Cl.
*H05K 7/12* (2006.01)
*H01R 13/24* (2006.01)
(Continued)

(52) U.S. Cl.
CPC ....... *H01R 13/2421* (2013.01); *H01R 12/714* (2013.01); *H01R 13/03* (2013.01)

(58) Field of Classification Search
CPC .......... H05K 2201/10568; H05K 2201/10575; H05K 2201/2036; H05K 2203/0182;
(Continued)

(56) References Cited

U.S. PATENT DOCUMENTS 4,029,375 A * 6/1977 Gabrielian ........... H01R 12/714
439/66
4,664,458 A * 5/1987 Worth .................... H01R 12/52
174/138 D
(Continued)

FOREIGN PATENT DOCUMENTS

KR 20-0332757 Y1 11/2003
KR 20-0396865 Y1 9/2005
(Continued)

OTHER PUBLICATIONS

International Search Report(PCT/KR2016/003980), WIPO, dated Jul. 26, 2016.

*Primary Examiner* — Phuong Dinh
(74) *Attorney, Agent, or Firm* — Park & Associates IP Law, P. C.

(57) ABSTRACT

An electric connecting terminal for use by interposing between electric conductive objects to electrically connect the objects to each other, the electric connecting terminal including a spring of a metallic material, and a contact part having electric conductivity, which is formed by being adhered to at least one end of the spring and configured to electrically contact the object, wherein the contact part is formed such that an electric conductive material in which a liquid polymer resin is mixed with metallic powder, is cured while enveloping the end of the spring, or is cured after flowing into an end hole formed in the spring.

28 Claims, 7 Drawing Sheets

(51) Int. Cl.
*H01R 12/71* (2011.01)
*H01R 13/03* (2006.01)

(58) Field of Classification Search
CPC ........... H05K 7/142; H05K 2001/2036; H05K 3/301; H05K 3/303; H05K 7/14; H01B 17/00
USPC ................ 361/578, 804; 439/66; 174/138 G, 174/138 D
See application file for complete search history.

(56) References Cited

U.S. PATENT DOCUMENTS

| | | | | |
|---|---|---|---|---|
| 5,281,149 | A * | 1/1994 | Petri | H05K 7/142 174/138 D |
| 5,641,315 | A | 6/1997 | Swart et al. | |
| 7,931,475 | B2 | 4/2011 | Kim et al. | |
| 8,602,830 | B2 * | 12/2013 | Ito | H01M 2/1066 439/876 |

FOREIGN PATENT DOCUMENTS

| | | | |
|---|---|---|---|
| KR | 10-2011-0101986 | A | 9/2011 |
| KR | 10-1266123 | B1 | 5/2013 |
| KR | 10-1330999 | B1 | 11/2013 |
| KR | 10-1437935 | B1 | 9/2014 |

* cited by examiner

ELECTRIC CONNECTING TERMINAL FOR ELECTRICALLY CONNECTING OBJECTS

REFERENCE TO RELATED APPLICATIONS

This is a continuation of International Patent Application PCT/KR2016/003980 filed on Apr. 18, 2016, which designates the United States and claims priority of Korean Patent Application No. 10-2015-0111612 filed on Aug. 7, 2015, Korean Patent Application No. 10-2015-0124490 filed on Sep. 2, 2015, and Korean Patent Application No. 10-2015-0131270 filed on Sep. 16, 2015, the entire contents of which are incorporated herein by reference.

FIELD OF THE INVENTION

The present invention relates to an electric connecting terminal, and more particularly, to an electric connecting terminal which has a low height and simple structure to facilitate manufacturing, and of which a manufacturing cost is low and characteristics are easy to change.

Furthermore, the present invention relates an electric connecting terminal of which an operating distance is long in comparison to the size and on which soldering is easily performed using vacuum pick-up.

BACKGROUND OF THE INVENTION

In order to electrically connect a conductive object such as an antenna of a smartphone to a conductive pattern of a circuit board or to electrically connect to the ground for eliminating static electricity or electromagnetic interference (EMI), an electric connecting terminal having elasticity may be used by soldering the same to the conductive pattern of the circuit board.

In particular, when used for testing an antenna contact of a smartphone or a circuit board, the electric connecting terminal is required to have low price, small size, low electric resistance, and good elasticity and elastic restoring force. In addition, for economical mounting, a reflow-solderable electric connecting terminal with vacuum pick-up may be required.

When the electric connecting terminal is used for forming a conductive path in up and down directions, in order to compensate for a vertical dimensional tolerance between a circuit board and a conductive object to be electrically connected, the electric connecting terminal is required to have an operating distance as long as possible in up and down directions and to be made from a predetermined material in a structure in which a soldering mounting is available by a surface-mount method for mass production.

For example, as a mechanical tolerance between the circuit board and the conductive object becomes greater, a longer operating distance of the electric connecting terminal is necessary to electrically connect the circuit board to the conductive object.

According to U.S. Pat. No. 7,931,475 filed by the present applicant, an elastic electric contact terminal is disclosed which includes a tube-shaped insulating elastic core, an insulating non-foam rubber coating layer adhered to the insulating elastic core to surround the insulating elastic core, and a heat-resistant polymer film having one surface adhered to the insulating non-foam rubber coating layer to surround the insulating non-foam rubber coating layer, and another surface integrally provided with a metal layer.

According to such a structure, an adhering process is included and makes a manufacturing process complicated, and there is a limit in reducing the size. In particular, when each of the diameter and height is 1 mm or shorter, it is difficult to manufacture the electric contact terminal.

As another prior art, Korean patent registration No. 1437935 filed by the present applicant discloses an electric connecting terminal including: a metal fixing member which electrically contacts an object and has a tubular shape, one end of which is open and the opening edge is bended inside to form a protrusion; a metal moveable member which is put into the fixing member to be slidably coupled and has a tubular shape, one end of which is open and the opening edge is bended outside to form a flange; and an electric conductive spring which is received in the fixing member, one end of which contacts the bottom of the fixing body, another end of which contacts the bottom of the movable member to make the movable member elastically slide to the fixing member, wherein the fixing member and the movable member are always electrically connected by the spring, the flange receives an elastic recovery force of the spring to be caught on the protrusion such that the movable member is prevented from being disengaged from the fixing member, the thickness of the flange corresponds to the thickness of the movable member, a horizontally flat plane is provided on the top surface of the movable body for vacuum pick-up, and the bottom surface of the fixing member is reflow-solderable with a solder paste.

In the foregoing structure, since a metal sheet is pressed to manufacture the movable member and the fixing member, a metallic spring is inserted therebetween, and then the fixing member is pressed again to be coupled to the movable member, it is expensive and hard to assemble.

In particular, when each of the diameter and height of the electric connecting terminal is 1 mm or smaller, since each component has small dimensions, it is hard to manufacture and assemble to result lowering of productivity.

Furthermore, in view of structure, it is hard to economically manufacture a product of which diameter or width is 0.8 mm or smaller, and there is a limit in making an operating distance long in comparison to the size.

According to another prior art of Korean patent registration No. 1330999, a probe part-connected pogo pin is disclosed in which a hollowed cylindrical opening part is formed at a bottom end of a top probe part, a bottom probe part includes an insertion part which is inserted into the opening part, a spring surrounds the inserting part and both ends thereof are fixed at the top and bottom probe parts, and the top probe part, the bottom probe part, and the spring are integrated to one body.

Since a mold cost of such a pogo pin is expensive and only one product is produced with one mold, it is hard to economically provide an electric connecting terminal having various characteristics and to manufacture a product of which each of the width and height is 0.5 mm or smaller.

SUMMARY OF THE INVENTION

An object of the present invention is to provide an electric connecting terminal which has a small size, low height and simple structure, and is easy to manufacture.

Another object of the present invention is to provide an electric connecting terminal which has reliable and low electric resistance, good elasticity and elastic recovery force, and takes a small force to press.

A further another object of the present invention is to provide an electric connecting terminal which is easy to electrically and mechanically contact an object and has a long operating distance.

A still further another object of the present invention is to provide an electric connecting terminal which is easy to be mounted on an instrument and has good environmental resistance.

An even further another object of the present invention is to provide an electric connecting terminal which makes less scratches or scars on an opposing object.

A yet further another object of the present invention is to provide an electric connecting terminal on which reflow soldering is easily performed with vacuum pick-up.

A yet further another object of the present invention is to provide an electric connecting terminal which has small dimensions and is easy to economically change mechanical and electrical characteristics such as an elastic recovery force, pressing power, an operating distance, and vertical electric resistance.

A yet further another object of the present invention is to provide an electric connecting terminal which makes it possible to reduce an inductance value and electric resistance formed on a spring.

A yet further another object of the present invention is to provide an electric connecting terminal which makes it possible to minimize a damage on a spring due to an external shock.

According to an aspect of the present invention, there is provided an electric connecting terminal for use by interposing between electric conductive objects to electrically connect the objects to each other, the electric connecting terminal including: a spring of a metallic material; and a contact part having electric conductivity, which is formed by being adhered to at least one end of the spring and configured to electrically contact the object, wherein the contact part is formed such that an electric conductive material in which a liquid polymer resin is mixed with metallic powder, is cured while enveloping the end of the spring, or is cured after flowing into an end hole formed in the spring.

The contact part may be formed at one end of the spring, and another end of the spring may be accommodated in a holder cup of a metallic material to be coupled thereto.

According to another aspect of the present invention, there is provided an electric connecting terminal, which is intervened between electric conductive objects to electrically connect the objects to each other, the electric connecting terminal including: an elastic coil spring of a metallic material; a cap of a metallic material with an electric conductive adhesive intervened at one end of the spring to be adhered; and a holder cup of a metallic material configured to be electrically connected to another end of the spring, wherein a height of the holder cup is a half of or smaller than that of the spring and a solderable plating layer is formed on an outer surface of the holder cup.

According to still another aspect of the present invention, there is provided an electric connecting terminal for use by interposing between electric conductive objects to electrically connect the objects to each other, the electric connecting terminal including: an elastic coil spring of a metallic material; a cap of a metallic material with an electric conductive adhesive at one end of the spring to be adhered; and a contact part having electric conductivity, which is adhered to another end of the spring and fixed by soldering to the object, wherein the contact part is formed such that an electric conductive material in which a liquid polymer resin is mixed with metallic powder, is cured while enveloping the end of the spring, or is cured after flowing into an end hole formed in the spring.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

Now, exemplary embodiments of the present invention will be described in detail with reference to the accompanying drawings.

Figure 1:
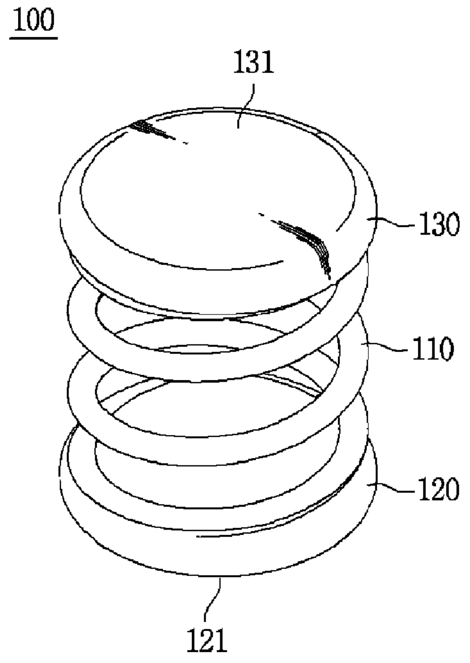
FIG. 1 illustrates an electric connecting terminal according to an embodiment of the present invention.
Figure 2:
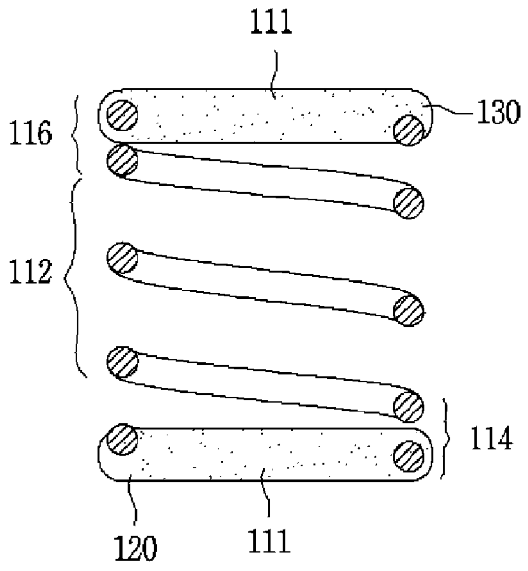
FIG. 2 is a cross-sectional view that the electric connecting terminal of FIG. 1 is vertically cut.
Figure 3:
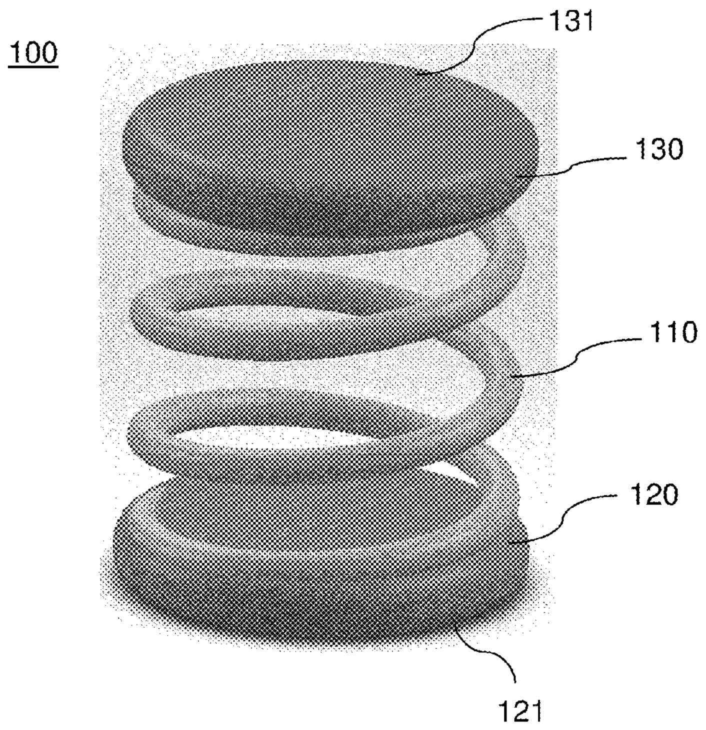
FIG. 3 is a photo image for a real product.

FIG. 1 illustrates an electric connecting terminal according to an embodiment of the present invention, FIG. 2 is a cross-sectional view that the electric connecting terminal of FIG. 1 is vertically cut, and FIG. 3 is a photo image for a real product.

An electric connecting terminal 100 is formed of a spring 110 of a metallic material having good elasticity and contacting parts 120 and 130 adhered to both ends of the spring 110 and having electric conductivity.

According to such a structure, the electric connecting terminal 100 is positioned between electric conductive objects, which oppose to each other, to elastically and electrically connect the objects due to compression and recovery of the spring 110.

As the electric conductive object, there may be a conductive pattern of a circuit board and a speaker terminal, and in this case, the conductive contact part 120 is fixed to the conductive pattern of the circuit board by soldering or the like. The speaker terminal press-contacts the conductive contacting part 130 to electrically connect, by the elasticity, the conductive pattern of the circuit board with the speaker terminal.

Although not particularly limited, the size of the electric connecting terminal 100 is as the following: the inner diameter of the electric connecting terminal 100 may be 0.10 mm to 1.5 mm, the height thereof may be 0.3 mm to 1.5 mm, a pressing force of the electric connecting terminal 100 may be 2 gf to 80 gf, and the operating distance of the electric connecting terminal 100 may be 40% or higher of an initial height.

The spring 110 having small dimensions is easy to manufacture in a coil shape, and for example, the entire shape of the electric connecting terminal 100 may be a cylindrical shape.

Referring to FIG. 2, the spring 110 is formed of an elastic part 112 of which a middle part is wound with a constant pitch, and supporting parts 114 and 116 formed by being wound to both ends of the elastic part 112.

In this example, the elastic part 112 is formed with about 2 to 2.5 turns and the supporting parts 114 and 116 are formed with about 1 to 1.5 turns.

The dimensions of the spring 110 may be, for example, the height of 0.95 mm, the turn outer diameter of 0.63 mm, and the pitch of the elastic part 112 of 0.25 mm, but are not limited thereto.

The spring 110 may be made by winding, in a coil shape, a copper alloy wire such as a phosphor bronze wire or a beryllium copper wire of which the cross-section is a circle and the line diameter is 0.01 mm to 0.15 mm and which has large mechanical strength and good elasticity, or an iron alloy wire such as a stainless wire or a piano wire.

The external surface of the spring 110 may be sequentially plated with nickel/gold or nickel/palladium (Pd) having good electric conductivity and environmental resistance, and in particular, the stainless wire or piano wire having good mechanical characteristics but having large electric resistance is thickly plated with copper or gold having good electric conductivity to reduce the entire electric resistance.

As described above, the spring 110 may have a coil shape with small dimensions to be easily manufactured and the turn diameters of the elastic part 112 and the supporting parts 114 and 116 may be made identical or relatively different from each other.

The number of turns of the elastic part 112, which forms the spring 110, is not limited, but may be 2 or greater in order to make the operating distance long and the pitch of the elastic part 112 may be properly designed to secure a constant elastic force.

The supporting parts 114 and 116 improve supporting strength and as will be described later, the pitch may be removed such that the contact parts 120 and 130 are reliably formed and adjacent turns may contact with each other.

In order to make the operating distance of the electric connecting terminal 110 long, the height of the supporting parts 114 and 116 is formed to be smaller than that of the elastic part 112 and a separation distance between the contact parts 120 and 130 may be a half or more of the height of the electric connecting terminal 100.

Referring to FIG. 1, the contact parts 120 and 130 are formed by vertically dipping both ends of the spring 110 in a liquid electric conductive material in which electric conductive metal powder is mixed with a liquid polymer resin, which has adhesion property after being cured, and then taking out to cure the ends of the spring 110. Here, the liquid electric conductive material adheres to the spring 110 after being cured by heat or an ultraviolet (UV) ray.

Beside the dipping method, the liquid electric conductive material may be flowed, by impregnation, into end holes 111 of the spring 110 to be cured. In this case, the liquid electric conductive material may be flowed into the end holes 111 at a height corresponding to the supporting parts 114 and 116, and leaked externally through cracks between turns at the supporting parts 114 and 116.

In any case, the contact parts 120 and 130 may be formed to block the holes formed in the end of the spring 110.

The contact parts 120 and 130, which are formed by curing of the polymer resin, may be made to have smaller mechanical hardness (strength) than the spring 110 such that scratches or scars are not be left on the opposing object.

The vertical electric resistance of the electric connecting terminal 100 is not particularly limited, but may be 0.5 ohm or smaller. As the spring 110 gets more compressed, the vertical electric resistance may be slightly reduced. Under a certain normal condition, it is better to maintain the vertical electric resistance 0.5 ohm or smaller.

As described above, the contact parts 120 and 130 are formed by dipping the supporting parts 114 and 116 of the spring 110 into the liquid electric conductive material and then taking out to be cured. The electric conductive material may be formed by mixing metal powder such as silver having good electric conductivity with a liquid material of an epoxy resin having heat resistance to be tolerant to soldering, a polymer resin such as a polyimide resin, or an elastic rubber such as a silicone rubber, and may have adhesion to the spring 110 after being cured.

Although the contact parts 120 and 130 may be formed of an electric conductive epoxy resin or an electric conductive polyimide resin, any one of the contact parts 120 and 130 is configured with the electric conductive epoxy resin or the electric conductive polyimide resin, and the other may be the electric conductive silicone rubber. In this case, one of the contact parts 120 and 130 may be fixed by soldering to one object and the other may contact the other object by physical pressure.

In addition, when configured of a silicone rubber, since having elasticity and low hardness (strength) after being cured, the contact parts 120 and 130 electrically contact the opposing object with elasticity and fewer scratches.

Here, the curing is performed by heat of high temperature, an UV ray or the like.

As well known, a liquid conductive resin or conductive rubber is formed by mixing conductive particles such as silver or silver-plated copper sufficiently much with the liquid resin or rubber, and may be made to have viscosity of a degree thicker than that of corn syrup Accordingly, when the supporting parts 114 and 116 of the spring 110 are vertically dipped into the liquid electric conductive material and then taken out, the liquid electric conductive material flows down along the outer surfaces of the supporting parts 114 and 116 to be cured and as illustrated in FIGS. 1 and 3, curved parts are formed on the outer surfaces of the contact parts 120 and 130.

On the other hand, in the case of the above-described impregnation, since the liquid electric conductive material is flowed only into the end holes 111 of the spring 110 to be cured, the liquid electric conductive material may not be flowed down on outer surfaces of the supporting parts 114 and 116 to be cured.

Such dipping may be performed once or multiple times while the viscosity and type of the liquid electric conductive material, the size and shape of end hole of the spring, the size and shape of the metallic powder, and the shape of the conductive contacting part are properly adjusted, since performance conditions may be differed according thereto.

For example, when the diameter of the end hole 111 of the spring 110 is approximately 0.8 mm, which is relatively large, the conductive contacting parts 120 and 130 may be formed by using metallic powder having high viscosity and a relative large size and by making the viscosity relatively high.

When the supporting parts 114 and 116 of the spring 110 are vertically dipped into the liquid electric conductive material and then taken out, the contacting parts 120 and 130 are formed while the end holes 111 of the spring 110 are blocked in a semi-cured state. At this time, protrusion occurs downward from the end holes 111 of the spring 110 by the gravity.

In the present embodiment, the contacting parts 120 and 130 protruding downward are compressed approximately horizontally to make the top and bottom surfaces of the contact parts 120 and 130 be flush with each other. Unlike this, end surfaces 121 and 131 may be formed in a shape (a hemisphere shape) that the contacting parts 120 and 130 protrude downward to slightly protrude outside toward the center of the end holes 111.

In this way, when the end holes 111 of the spring 110 are blocked by the contact parts 120 and 130 and the end surfaces 121 and 131 of the contact parts 120 and 130 protrude slightly outside toward the center, it is easy to electrically contact the opposing object and vacuum pick-up is also possible.

On the contrary, when the supporting parts 114 and 116 of the spring 110 are vertically dipped into the liquid electric conductive material and then taken out, and the spring 110 is turned in the opposite direction in a semi-cured state to be cured, the contact parts 120 and 130 are formed while the end holes 111 of the spring 110 are blocked. The end surfaces 121 and 131 of the contact parts 120 and 130 become to have a slightly hollowed shape (a hemisphere shape) toward the center by self weight in the end holes 111.

In this way, when the object is, for example, a solder ball, the end surfaces 121 and 131 of the contact parts 120 and 130 in the slightly hollowed shape toward the center may secure a large contact area with the circular outer surface of the solder ball. Consequently, the electric contact resistance becomes smaller and vacuum pick-up is also possible.

In this state, complete curing is performed to manufacture the electric connecting terminal 100, and then the entirety may be plated with nickel/gold or nickel/palladium.

For example, nickel having high hardness may be primarily plated on the spring 110 and the contact parts 120 and 130 and then gold, which has good electric conductivity and environmental resistance and is easily soldered, may be secondarily plated.

In particular, the thickness of the nickel-plated layer having high mechanical strength may be adjusted to control a compressive force and recovery force of the electric connecting terminal 100, or to control the strength of the electric connecting terminal 100, and the thickness of the gold-plated layer having good electric conductivity may be adjusted to control the vertical electric resistance of the electric connecting terminal 100.

In the present embodiment, although it is exemplified that the end holes 111 of the spring 100 are blocked by the contact parts 120 and 130, the embodiment is not limited thereto and a through-hole smaller than the end holes 111 may be formed at the centers of the end surfaces 121 and 131 of the contact parts 120 and 130.

The electric connecting terminal 100 may be reel-taped on a carrier, a flat surface on which vacuum pick-up is possible is provided on any one of the end surfaces 121 and 131 to be vacuum-picked up on the corresponding end surface 121 or 131 to be surface-mounted and reflow soldering by a solder paste may be performed on the other end surface 121 or 131. In addition, the embodiment is not limited thereto, and the electric connecting terminal 100 may be put into an instrument, for example, a socket for terminal test to be used.

Figure 4:
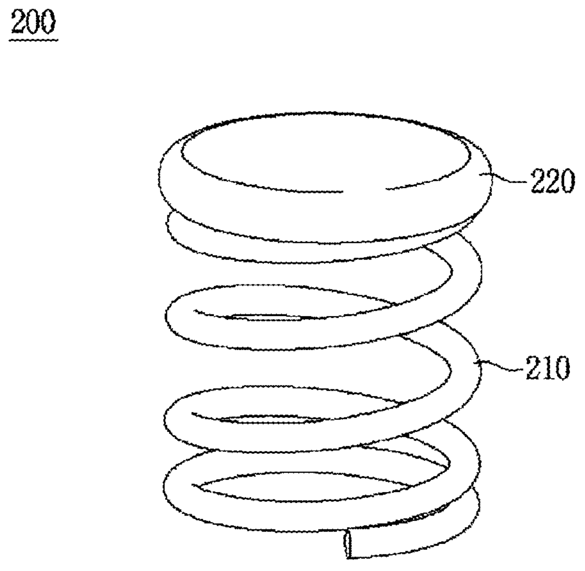
FIG. 4 illustrates an electric connecting terminal according to another embodiment of the present invention.

FIG. 4 illustrates embodiment of an electric connecting terminal according to another embodiment of the present invention.

In the present embodiment, the electric conductive contact part 220 of the electric connecting terminal 200 is formed only on the top end of the spring 210.

The bottom end of the spring 210 on which the contact part is not formed may be fixed to an object, for example, a circuit board by soldering with a solder paste, but is not limited thereto.

Figure 5A:
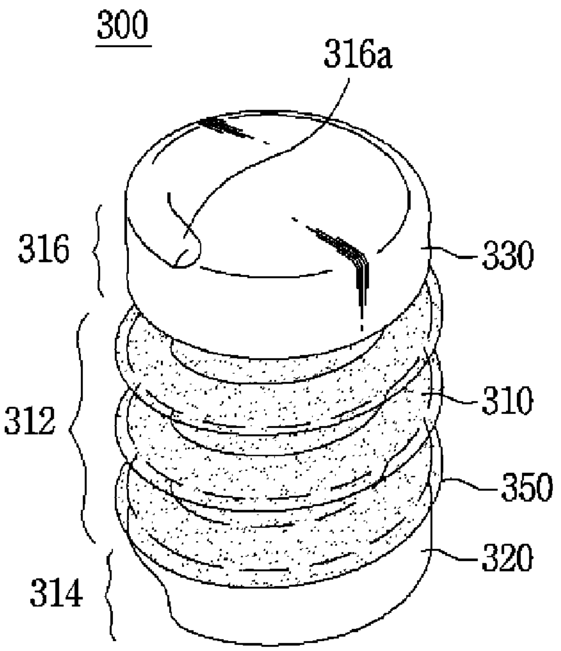
FIGS. 5A and 5B illustrate an electric connecting terminal according to another embodiment of the present invention.
Figure 5B:
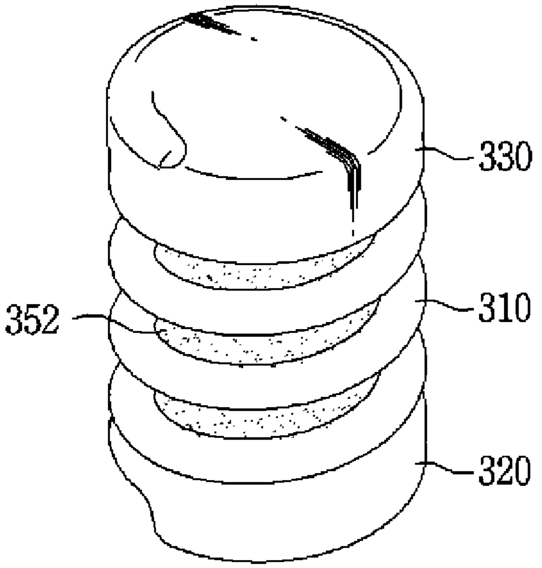

FIGS. 5A and 5B illustrate an electric connecting terminal according to another embodiment of the present invention.

According to the present embodiment, elastic rubber layers 350 and 352, for example, silicone rubber layers may be adhered to the elastic part 312 of the spring 310.

The elastic rubber layers 350 and 352 may be formed by forming the contact parts 320 and 330, coating a liquid silicone rubber on the elastic part 312 of the spring 310 by using a needle or the like, and then curing the same, but the method is not limited thereto.

In a case where only one of the contact parts 320 and 330 is formed, when a part of the spring 310 at which the contact parts 320 and 330 are not formed is dipped into the liquid silicone rubber and cured, and then the elastic rubber layer formed on the end on which the contact parts 320 and 330 are not formed is removed by grinding or the like, the end of the spring 310 is exposed externally.

Thereafter, when nickel/gold or the like is electrically plated, since the elastic rubber layers 350 and 352 are not plated, the elastic part 312 on which the elastic rubber layer is formed may maintain spring performance such as elasticity. In other words, the electric connecting terminal 300 may have mechanical performance due to the elastic rubber layers 350 and 352 in addition to the spring performance due to the elastic part 312 of the spring 310.

The hardness of the elastic rubber layers 350 and 352 may be Shore A 20 to 75 in consideration of a pressing force and recovery ratio, etc.

According to such a structure, it is advantageous that a metallic wire, which forms the spring 310, is not easily stretched or deformed by an external shock applied from sides by the elastic rubber layers 350 and 352, which are formed by being adhered to the elastic part 312 of the spring 310.

In addition, the pressing force and recovery ratio of the electric connecting terminal 300 may be adjusted by the elastic rubber layers 350 and 352.

When the elastic rubber layers 350 and 352 have electric conductivity, there are additional effects of reducing an impedance value due to the spring 310 and lowering the electric resistance.

As shown in FIG. 5A, the elastic rubber layers 350 and 352 may be formed to surround the elastic part 312 of the spring 310, or as shown in FIG. 5B, may be formed only inside the elastic part 312 of the spring 310.

On the other hand, referring to FIG. 5A, the end part 316*a* of the supporting part 316 of the spring 310 is still shown as protruding, although the height thereof is slightly lowered by the contact part 330, which is formed by a polymer resin being cured.

Accordingly, when the polymer resin is cured to form the contact part 330 in a state where a certain part, which is adjacent to the end part 316*a* of the supporting part 316, is bended downward through an end hole to lower the protrusion height of the end part 316*a* to a certain degree in advance, the height of the end part 316*a* may be definitely lowered.

In addition, in order that the end surfaces of the contact parts 320 and 330 are flattened to facilitate vacuum pick-up and to secure a wide contact area, before and after the contact parts 320 and 330 are formed, the end surfaces of the contact parts 320 and 330 may be ground using a grinder to remove some of the supporting parts 314 and 316 of the spring 310.

In this case, there is an additional effect that in the contact parts 320 and 330, some of the supporting parts 314 and 316 of the ground spring 310 are exposed from the end surfaces of the contact parts 320 and 330 and directly contact and are electrically connected to the object to reduce the electric resistance.

Figure 6:
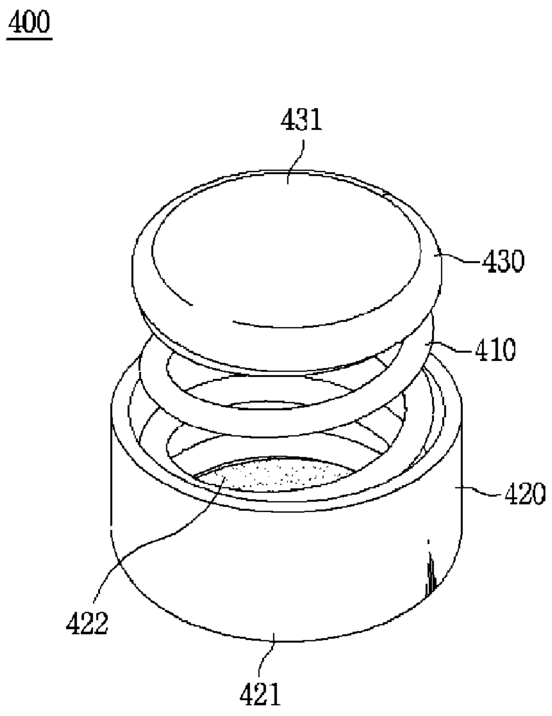
FIG. 6 illustrates an electric connecting terminal according to another embodiment of the present invention.
Figure 7:
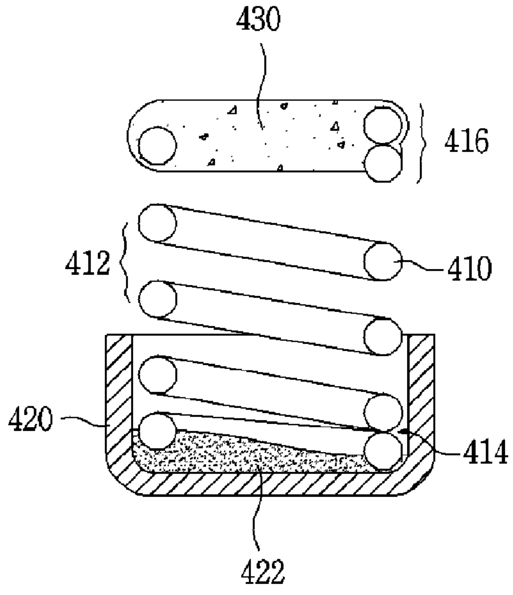
FIG. 7 is a cross-sectional view that the electric connecting terminal of FIG. 6 is vertically cut.

FIG. 6 illustrates embodiment of an electric connecting terminal according to another embodiment of the present invention, and FIG. 7 is a cross-sectional view that the electric connecting terminal of FIG. 6 is vertically cut.

An electric connecting terminal 400 is formed of a coil spring 410 of a metallic material, a contact part 430 adhered to one end of the spring 410 to have electric conductivity, and a holder cup 420 adhered with an electric conductive adhesive 422 lying on the other end.

According to such a structure, the holder cup 420 is fixed by soldering to a conductive pattern of a circuit board, and a speaker terminal or an antenna terminal press-contacts the conductive contacting part 430 to electrically connect, by elasticity, the conductive pattern of the circuit board and the speaker terminal or the antenna terminal.

The holder cup 420 may be formed of a single body of a metallic material such as copper or a copper alloy with low hardness and may be, for example, a press product manufactured by pressing a metallic sheet having 0.05 mm to 0.15 mm thickness with a drawing mold. In this way, since holder cup 420 is formed by pressing the metallic sheet, it is advantageous in that massive production is facilitated, usability is good, manufacturing is facilitated to improve a yield, and a manufacturing cost is low.

In view of appearance shown in FIG. 6, the holder cup 420 is provided with a cylindrical body 421 of which a top surface is open and a bottom surface is blocked, but is not limited thereto. Here, corners of the bottom surface of the holder cup 420 may be round-processed to increase a soldering area and to increase soldering strength.

Referring to FIG. 7, for example, the height of the holder cup 420 is about a half of or smaller than the entire height. In order to make the operating distance longer, the height of the holder cup 420 may be about a half of or smaller than that of the spring 410, but is not limited thereto.

In addition, the inner diameter of the holder cup 420 may be formed to be equal to or slightly greater than the turn diameter of the spring 410. In the equal case, the spring 410 contacts the inner wall of the holder cup 420 to reduce the vertical electric resistance and also reduce the inductance values. In the greater case, the pressed spring 410 is accommodated inside the holder cup 420 to lengthen the operating distance.

As described above, the bottom supporting part 414 of the spring 410 is adhered to be fixed to the bottom of the holder cup 420 with the electric conductive adhesive 422 interposed therebetween. An amount of the electric conductive adhesive 422 filled in the holder cup 420 is sufficient for the supporting part 414 to be fixed to the bottom of the holder cup 420.

The electric conductive adhesive 422 may be one formed such that a liquid electric conductive adhesive in which a polymer resin including a heat resistant rubber is mixed with metallic powder, is adhered by curing or soldering.

The vertical electric resistance of the electric connecting terminal 400 may be reduced by the electric conductive adhesive 422.

Although not illustrated, the spring 410 and the holder cup 420 may be welded to be adhered by laser welding or the like without using the electric conductive adhesive 422.

According to such a structure, since the bottom end of the spring 410 is put into the holder cup 420 to be fixed to the bottom, an external force applied to the spring 410 may be blocked by the holder cup 420 to a certain degree.

In other words, when there is not the holder cup 420, since the spring 420 exposed externally is long, it is more possible to be deformed by the external force. However, when there is the holder cup 420, since the spring 420 exposed externally is short, it is less possible to be deformed by the external force.

In addition, since the center of gravity of the electric connecting terminal 400 is positioned at the holder cup 420 due to the weight of the holder cup 420, shaking due to hot air, which is blown at the time of reflow soldering, is minimized and stable reflow soldering may be performed.

In addition, when the holder cup 420 is soldered, since the solder rises along the holder cup 420, the elasticity of the spring 410 is not affected.

On the other hand, the manufactured electric connecting terminal 400 may be plated with nickel/gold or palladium in the entirety. For example, nickel having high hardness may be primarily plated on the spring 410 and the contact parts 430, and then gold, which has good electric conductivity and environmental resistance and is easily soldered, may be secondarily plated.

In particular, the thickness of the nickel-plated layer having high mechanical strength may be adjusted to control a compressive force and recovery force of the electric connecting terminal 400, or to control the strength of the electric connecting terminal 400, and the thickness of the gold-plated layer having good electric conductivity may be adjusted to control the vertical electric resistance of the electric connecting terminal 400.

In addition, after the contact part 430, the spring 410 and the holder cup 420 are assembled, the entirety may be plated with a metal such as solderable gold or the like to lower the vertical electric resistance, improve environmental resistance, and reduce a manufacturing cost.

The electric connecting terminal 400 may be reel-taped on a carrier, a flat surface on which vacuum pick-up is possible is provided on the end surface 431 of the contact part 430 to be vacuum-picked up and surface-mounted, and reflow soldering by a solder paste may be performed on the holder cup 420.

FIGS. 8A to 8E are respective electric connecting terminals according to other embodiments of the present invention.

In the description below, like reference numerals are given to like components in order to avoid confusion.

Figure 8A:
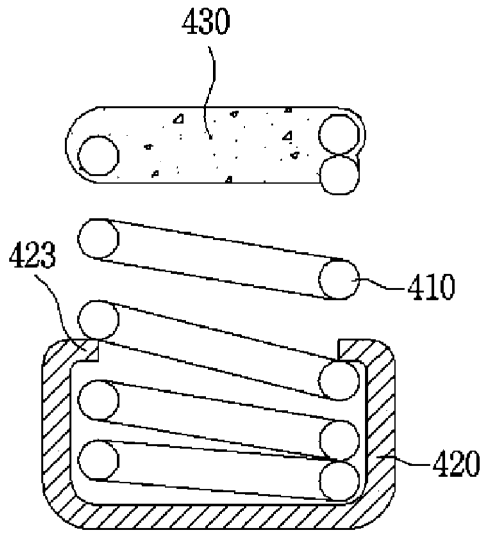
FIGS. 8A to 8E are respective electric connecting terminals according to other embodiments of the present invention.

Referring to FIG. 8A, an opening edge of the holder cup 420 is bended inside to form a flange 423, and the flange 423 is formed to have a width to be overlapped with the spring 410.

According to such a structure, a portion of the spring 410 is accommodated inside the holder cup 420 by the flange 423 to be prevented from being disengaged externally.

As the result, the spring 410 becomes substantially fixed to the holder cup 420 by the flange 423 without the electric conductive adhesive 422 of the foregoing embodiment.

However, the embodiment is not limited thereto, and the spring 410 may be more strongly coupled to the holder cup 420 by using the electric conductive adhesive 422.

The number of turns of the spring 410 accommodated inside the holder cup 420 is not specifically limited, but is sufficient for the flange 423 to receive the elastic recovery force from the spring 410 such that the spring 410 is strongly fixed between the flange 423 and the bottom of the holder cup 420 inside the holder cup 420.

Figure 8B:
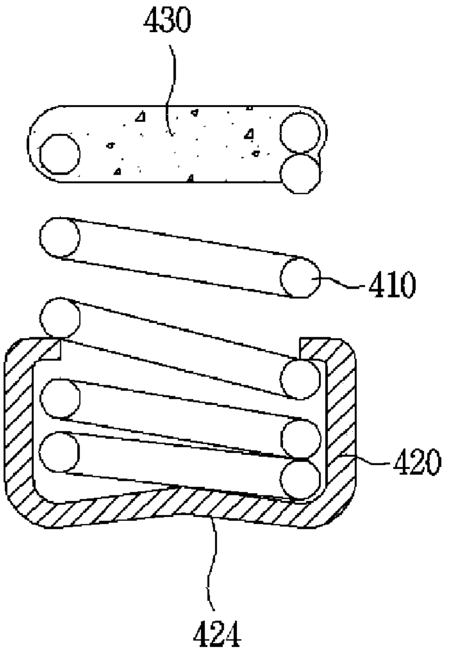

Referring to FIG. 8B, the bottom surface of the holder cup 420 is formed to include an inclined surface 424, which slopes from the edge toward the center, to cave in.

It is very difficult to secure the bottom surface of the holder cup 420 as a reliably horizontal surface in a manufacturing process for mass production. According to such a structure, however, the bottom surface of the holder cup 420 is made to cave in toward the center, so that a molten solder boils up at the time of soldering, a cave-in portion in the bottom surface of the holder cup 420 partially absorbs movement of the molten solder to rectify the inclination of the holder cup 420 and to prevent delaminating or leaning of the solder. As a result, reliability of the soldering may be improved.

In addition, due to the cave-in portion, the surface area of the bottom surface of the holder cup 420 increases to result in enhancing the soldering strength.

Figure 8C:
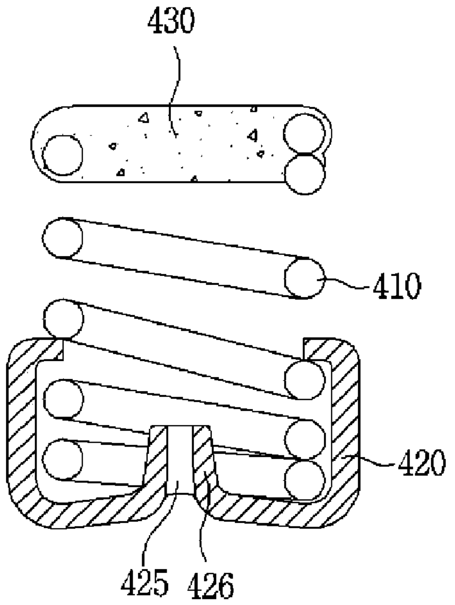

Referring to FIG. 8C, a hole 425 is formed at the bottom center of the holder cup 420, and a rib 426 protrudes inside the holder cup 420 to a constant height along the edge of the hole 425.

According to such a structure, since the rib 426 having the constant height penetrates inside from the bottom end of the spring 410, even though the spring 410 is elastically deformed, it is less possible that the bottom end of the spring 410 is disengaged from the rib 426 to be twisted.

The rib 426 may be consecutively formed, for example, by a process for forming the hole 425. For example, while the hole 425 is formed, a flesh (thickness) portion forming the lower part of the holder cup 420 becomes thin to be stretched.

The height of the rib 426 is required to be lower than that of the holder cup 420 and the outer diameter of the rib 426 is required to be smaller than the inner diameter of the turn of the spring 410.

In the present embodiment, the bottom surface of the holder cup 420 has a cave-in shape toward the center, but is not limited thereto. The bottom surface may be flat.

Figure 8D:
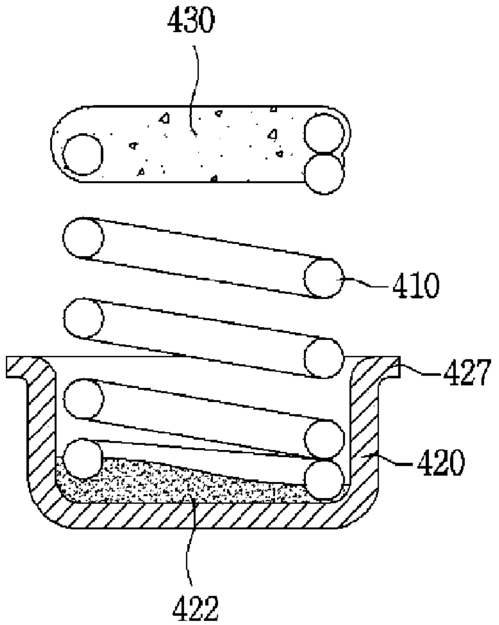

Referring to FIG. 8D, the opening edge of the holder cup 420 may be bended outward to form a protrusion 427.

According to such a structure, when the electric connecting terminal 400 is inserted into an instrument, for example, an insertion hole formed in an insulation film from the top to be fixed, the protrusion 427 is made to be mounted on the surface of the insulation film in order for the electric connecting terminal 400 to be uniformly mounted.

Figure 8E:
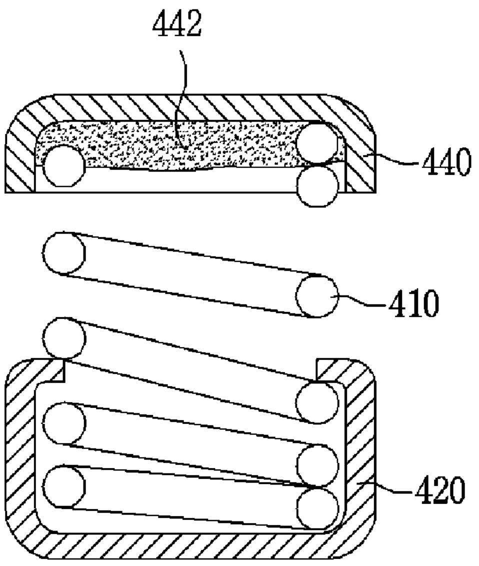

Referring to FIG. 8E, the electric conductive adhesive 442 lies on the top end of the spring 410 and a cap 440 is adhered thereto.

In other words, the cap 440, instead of the contact part 430 in the foregoing embodiment, covers the top end of the spring 410 to be adhered thereto and plays a role of the contact part 430.

The cap 440 is formed of the same material as that of the holder cup 420, has a very low height in comparison to the holder cup 420, for example, the height corresponding to about 1 to 1.5 turns of the spring 410.

According to such a structure, the top surface of the cap 440 maintains a smooth plane to reliably contact an object, and vacuum pick-upon thereon becomes easy.

The above-described structure is configured of a metallic spring having good elasticity, a good elastic recovery force and low electric resistance, and a conductive contact part formed at one end or both ends of the metallic spring and having low electric resistance. Therefore, it is advantageous in that it is easy to make the size very small and the height low, the structure is simple to be easily manufactured, has good elasticity and elastic recovery force even with small dimensions, and has low electric resistance.

In addition, since ends of the spring is dipped into or impregnated with a liquid electric conductive material and then hardened by curing to form the electric conductive contact parts, manufacturing is facilitated and the elastic part of the spring on which the electric conductive contact parts are not formed is well pressed with a small force to provide good elasticity and elastic recovery force.

In addition, the electric conductive contact part blocking an end hole of the spring makes vacuum pick-up easy and a contact area with an opposing object large. As the result, electric contact resistance becomes small.

In addition, the electric conductive contact part has a shape of slight cave-in or slightly protruding toward the center such that it is easy to provide stable physical or electrical contact with the opposing object.

In addition, materials, structures, dimensions, and shapes of the spring and electric conductive contact parts may be properly adjusted, or the thickness of a plated layer may be adjusted to easily control a pressing force, an elastic recovery force, and electric resistance, and it is easy to control an operating distance by adjusting dimensions of a supporting part and an elastic part of the spring.

In addition, it is advantageous that the material strengths of the electric conductive contact parts are smaller than that of the spring, so that fewer scratches or scars are left to the opposing object.

In addition, since a solderable metal layer having good environmental resistance and electric conductivity is formed by plating on the entire external surface of the spring and electric conductive contact parts, vertical electric resistance becomes further lowered, the environmental resistance becomes better, and soldering becomes easy.

In addition, a rubber layer, which is adhered to the elastic part of the spring and has elasticity, protects the spring from an external shock and controls a solder height at the time of soldering, and in particular, reduces values of inductance formed between spring elements and vertical electric resistance of the electric connecting terminal, when having electric conductivity.

In addition, due to a holder cup, reflow soldering may be provided which enables easier soldering, has good soldering strength, is less shaky and stable at the time of reflow soldering with vacuum pick-up.

In addition, it is advantageous in that the holder cup plays a role of reducing deformation of the spring by an external force.

In addition, various electric connecting terminals may be manufactured to meet applications according to various structures of a holder cup and may be favorably used by putting into sockets.

In addition, it is advantageous that the vertical electric resistance may be reduced by the holder cup.

While the present invention has been described in detail, it should be understood that various changes, substitutions and alterations can be made hereto without departing from the spirit and scope of the invention as defined by the appended claims.

What is claimed is:

1. An electric connecting terminal for use by interposing between electric conductive objects to electrically connect the objects to each other, the electric connecting terminal comprising:

a spring of a metallic material; and a contact part having electric conductivity, which is adhered to at least one end of the spring and configured to electrically contact the object, wherein the contact part is formed such that a liquid electric conductive material, which is formed with a liquid polymer resin mixed with metallic powder, is cured while enveloping the end of the spring, or is cured after flowing into an end hole formed in the spring.

2. The electric connecting terminal of claim 1, wherein one end of the spring is enveloped with the electric conductive material by dipping, or the electric conductive material is flowed into the end hole of the spring by impregnation.

3. The electric connecting terminal of claim 1, wherein the polymer resin has heat resistance that a soldering condition is satisfied and is one of an epoxy resin, a polyimide resin, or an elastic rubber, and the contact part is adhered to the one end of the spring by curing of the polymer resin.

4. The electric connecting terminal of claim 1, wherein a solderable metallic plating layer is formed on outer surfaces of the spring and contact part.

5. The electric connecting terminal of claim 4, wherein the metallic metal layer is formed by sequentially plating nickel/gold or nickel/palladium (Pd).

6. The electric connecting terminal of claim 1, wherein hardness or strength of the contact part is smaller than that of the spring.

7. The electric connecting terminal of claim 1, wherein an end surface of the contact part is formed to be a flat surface by grinding and a portion of the spring is exposed from the end surface by the grinding.

8. The electric connecting terminal of claim 1, wherein the spring is configured of an elastic part, of which a middle part is wound with a constant pitch, and a supporting part formed by being wound to at least one end of the elastic part, and the supporting part corresponds to the contact part and is configured of adjacent turns contacting each other.

9. The electric connecting terminal of claim 8, wherein a sum of height of the supporting part is smaller than a height of the elastic part.

10. The electric connecting terminal of claim 1, wherein a shape of the contact part is one of a cave-in shape toward a center in a hemisphere shape and a protrusion shape.

11. The electric connecting terminal of claim 1, wherein the contact part formed at the one end of the spring is formed of any one of an electric conductive epoxy resin or a polyimide resin, and the contact part formed at another end is formed of an electric conductive silicone rubber, and the contact part at the one end is fixed by soldering to the object, and the contact part at the other end contacts the object by a physical pressure.

12. The electric connecting terminal of claim 1, wherein the contact part is formed of any one of an electric conductive epoxy resin or a polyimide resin.

13. The electric connecting terminal of claim 1, wherein an end of the spring at which the contact part is not formed is fixed by soldering to the object.

14. The electric connecting terminal of claim 1, wherein the contact part is formed at one end of the spring, and another end of the spring is accommodated in a holder cup of a metallic material to be coupled thereto.

15. The electric connecting terminal of claim 14, wherein the other end of the spring has an electric conductive adhesive intervened to be adhered to a bottom of the holder cup.

16. The electric connecting terminal of claim 15, wherein the electric conductive adhesive comprises an electric conductive polymer resin and a solder.

17. The electric connecting terminal of claim 14, wherein an opening edge of the holder cup is bended inside to form a flange and the flange is formed to have a width to be overlapped with the spring.

18. The electric connecting terminal of claim 17, wherein the flange receives an elastic recovery force by the spring accommodated inside the holder cup.

19. The electric connecting terminal of claim 14, wherein a bottom surface of the holder cup has an inclined surface of a shape that caves in from an edge toward the center.

20. The electric connecting terminal of claim 14, wherein a hole is formed at a center of the bottom surface of the holder cup and a rib protrudes inside the holder cup at a constant height.

21. The electric connecting terminal of claim 14, wherein an opening edge of the holder cup is bended outward to form a protrusion.

22. The electric connecting terminal of claim 14, wherein a solderable metallic plating layer is formed on the spring, an outer surface of the contact part and the holder cup.

23. The electric connecting terminal of claim 14, wherein the contact part is vacuum-picked up to be surface-mounted and a bottom surface of the holder cup is fixed by reflow soldering to the object.

24. The electric connecting terminal of claim 14, wherein a height of the holder cup is a half of or smaller than that of the spring.

25. The electric connecting terminal of claim 1, wherein the electric connecting terminal is reel-taped on a carrier.

26. The electric connecting terminal of claim 1, wherein the electric connecting terminal is fixed by soldering or put into a socket for test to be fixed.

27. An electric connecting terminal, which is to be interposed between electric conductive objects to electrically connect the objects to each other, the electric connecting terminal comprising:

an elastic coil spring of a metallic material;

a cap of a metallic material with an electric conductive adhesive disposed at one end of the spring to be adhered; and a holder cup of a metallic material configured to be electrically connected to another end of the spring, wherein a height of the holder cup is a half of or smaller than that of the spring and a solderable plating layer is formed on an outer surface of the holder cup.

28. An electric connecting terminal, which is to be interposed between electric conductive objects to electrically connect the objects to each other, the electric connecting terminal comprising:

an elastic coil spring of a metallic material;

a cap of a metallic material with an electric conductive adhesive disposed at one end of the spring to be adhered; and a contact part having electric conductivity, which is adhered to another end of the spring and fixed by soldering to the object, wherein the contact part is formed such that an electric conductive material in which a liquid polymer resin is mixed with metallic powder, is cured while enveloping the end of the spring, or is cured after flowing into an end hole formed in the spring.

* * * * *